(12) United States Patent
Norström et al.

(10) Patent No.: US 7,119,415 B2
(45) Date of Patent: Oct. 10, 2006

(54) MONOLITHICALLY INTEGRATED CIRCUIT COMPRISING A THIN FILM RESISTOR, AND FABRICATION METHOD THEREOF

(75) Inventors: Hans Norström, Solna (SE); Ted Johansson, Djursholm (SE)

(73) Assignee: Infineon Technologies AG, Munich (DE)

( * ) Notice: Subject to any disclaimer, the term of this patent is extended or adjusted under 35 U.S.C. 154(b) by 104 days.

(21) Appl. No.: 10/946,932

(22) Filed: Sep. 22, 2004

(65) Prior Publication Data

US 2005/0087845 A1    Apr. 28, 2005

(30) Foreign Application Priority Data

Oct. 24, 2003    (SE) .................................... 0302810

(51) Int. Cl.
    *H01L 29/00*    (2006.01)
(52) U.S. Cl. .................. 257/536; 257/335; 257/340; 257/343; 257/379; 257/409; 257/E29.009; 257/E29.011
(58) Field of Classification Search ................ 257/335, 257/340, 343, 379, 409, 536, E29.009, E29.011
    See application file for complete search history.

(56) References Cited

U.S. PATENT DOCUMENTS 5,252,848 A    10/1993    Adler et al. ................. 257/328
5,382,826 A *  1/1995    Mojaradi et al. ........... 257/489
6,222,229 B1 * 4/2001    Hebert et al. ............... 257/327
6,525,390 B1 * 2/2003    Tada et al. .................. 257/489

OTHER PUBLICATIONS

C. Dragon, et al.; "A Silicon MOS Process for Integrated RF Power Amplifiers"; MTT-S; p. 257-260, 1996.

A. Lofti; VLSI Handbook (ed. Chen, pp. 7-9-7/11; CRC Press LLC), 2000.

* cited by examiner

*Primary Examiner*—Kenneth Parker
*Assistant Examiner*—Matthew E. Warren
(74) *Attorney, Agent, or Firm*—Baker Botts L.L.P.

(57) ABSTRACT

A monolithically integrated circuit comprises a thin film resistor (8) with low resistance and low temperature coefficient; a high frequency lateral power transistor device (9) including gate (17), source (16) and drain (15) regions, and a Faraday shield layer region (22; 22') above the gate region; and at least a first metallization layer (28) there above for electrical connection of the gate (17), source (16) and drain (15) regions through via holes filled with conductive material (29c–d). The thin film resistor (8) and the Faraday shield layer region (22; 22') are made in the same conductive layer, which is arranged below the first metallization layer (28).

13 Claims, 2 Drawing Sheets

MONOLITHICALLY INTEGRATED CIRCUIT COMPRISING A THIN FILM RESISTOR, AND FABRICATION METHOD THEREOF

PRIORITY

This application claims priority to Swedish application no. 0302810-7 filed Oct. 24, 2003.

TECHNICAL FIELD OF THE INVENTION

The present invention generally relates to the field of integrated circuit technology, and more specifically the invention relates to a monolithically integrated circuit comprising a thin film resistor, and to a fabrication method of the integrated circuit with the thin film resistor.

DESCRIPTION OF RELATED ART AND BACKGROUND OF THE INVENTION

A comprehensive overview of available techniques for integrated circuit resistors is given e.g. in chapter 7.3, pp. 7-9–7-11, in the VLSI Handbook (ed. Chen) by A. Lotfi, CRC Press LLC, 2000.

The main different types of resistors are: (i) diffused or bulk resistors, (ii) resistors utilizing parasitic elements of devices (pinch, epitaxial or MOS), and (iii) thin film resistors. The main drawback with diffused resistors is the large parasitic capacitances. Bulk resistors have also to be carefully designed if high breakdown voltage is needed. The same is basically true also for the parasitic element resistor types. The thin-film resistors can be made of deposited polycrystalline silicon, which is used in most integrated circuit fabrication processes, e.g. as gate or emitter material, or of thin metal or metal silicide layers. The tolerances can be made very low and there is a large range of different materials available.

In common BiCMOS processes, several types of polycrystalline silicon thin-film resistors are available in the 50–5000 Ohm/square range. There is usually a trade-off between resistivity and temperature dependence. At around 500 Ohm/square, the temperature dependence is close to zero, but at lower resistivity values, the dependence increases fastly to high positive values. The resistors are usually placed on top of field oxide areas to obtain low parasitic capacitances, and to avoid any risk of breakdown to the substrate. The gate/emitter polycrystalline silicon is used for the resistors, and a few masks added to the process to block some of the implants for the highly doped gates and emitters are needed. Another mask to block the gate/emitter silicide formation may also be required for the resistors.

In LDMOS integrated radio frequency power amplifiers, on-chip resistors for trimming and stabilizing are used, see e.g. C. Dragon, J. Costa, D. Lamey, D. Ngo, W. Burger, "A Silicon MOS Process for Integrated RF Power Amplifiers", MTT-S 1996, p. 257. The polycrystalline silicon gate layer with silicide top layer is used, and thus no additional process steps are needed. The resistivity values of these resistors are in the 1–5 Ohm/square range and are expected to have high positive temperature dependence.

SUMMARY OF THE INVENTION

Since the integrated trimming resistors used for the LDMOS circuits usually have very small values, it is difficult to efficiently design such resistors using the normal BiCMOS resistors described above, which have values in the 50–5000 Ohm/square range and usually requires at least two additional mask layers.

By using the silicided gate layer, which is highly doped, low values resistors in the 1–5 Ohm/square range can be made without using any additional masks. However, the temperature dependence of these resistors is high.

Another drawback is the relatively large difference in resistivity between these two resistors.

Radio frequency power devices are operated at high temperatures and high frequencies, where temperature effects and parasitics have a crucial role for the performance and stability of the circuits, another kind of integrated resistor and a fabrication method thereof would be desirable.

Accordingly, it is an object of the present invention to provide a monolithically integrated high frequency circuit comprising a resistor, which overcomes the problems associated with the prior art described above.

Further, it is an object of the invention to provide a method in the fabrication of an integrated circuit, particularly an integrated circuit for radio frequency applications, which includes a resistor that accomplishes the above object.

These objects can according to the present invention be attained by a monolithically integrated circuit comprising a thin film resistor, a high frequency lateral power transistor device including gate, source and drain regions, and a Faraday shield layer region above the gate region, and at least a first metallization layer there above for electrical connection of the gate, source and drain regions through via holes filled with conductive material, wherein the thin film resistor and the Faraday shield layer region are made in the same conductive layer, and the conductive layer is arranged below the at least first metallization layer.

The conductive layer may have a thickness in the range of about 400–3000 Å, preferably in the range of about 400–1500 Å, more preferably in the range of about 600–1000 Å, and most preferably of about 800 Å. The monolithically integrated circuit may further comprise source and drain contact regions on top of the source and drain regions, wherein the source and drain contact regions are made in the conductive layer. The thin film resistor can be galvanically connected to the source contact region. The thin film resistor can be connected to the at least first metallization layer through at least one via hole filled with conductive material. The conductive layer may comprise a transition metal, particularly titanium. The conductive layer can be a bi-layer. The thin film resistor can be located in an area laterally separated from the high frequency lateral power transistor device. The thin film resistor can be located in an area above the gate region of the high frequency lateral power transistor device. The power transistor device can be an LDMOS device. The Faraday shield layer region can be provided on top of an oxide region, the Faraday shield layer region covering an edge of the gate region as seen from above, preferably an edge neighboring the drain region, and leaving a portion of the drain region uncovered as seen from above. The oxide region may overlap with the gate region as seen from above, and has a substantially planar upper surface. The upper surface of the oxide region can be chemically mechanically polished or planarized using masking and dry back-etching.

The object can further be achieved by a method in the fabrication of an monolithically integrated circuit, particularly an integrated circuit for high frequency applications, including a thin film resistor and a lateral power transistor device, the method comprising the steps of:

providing a semiconductor substrate, forming source and drain regions in the substrate, forming a gate region on the substrate, depositing an oxide on top of the source, drain and gate regions, patterning and etching the oxide to expose portions of the source and drain regions, depositing a conductive layer on top of the oxide, forming in the conductive layer the thin film resistor and a Faraday shield layer region for the lateral power transistor device, and forming at least a first metallization layer above the thin film resistor and the Faraday shield layer region formed in the conductive layer for electrical connection of the gate, source and drain regions through via holes filled with conductive material.

The conductive layer can be deposited to a thickness in the range of about 400–3000 Å, preferably in the range of about 400–1500 Å, more preferably in the range of about 600–1000 Å, and most preferably of about 800 Å. The conductive layer can be deposited on top of the exposed portions of the source and drain regions, and source and drain contact regions can be formed in the conductive layer on top of the source and drain regions. The thin film resistor can be galvanically connected to the source contact region. The thin film resistor can be connected to the at least first metallization layer through at least one via hole filled with conductive material. The thin film resistor can be formed in an area laterally separated from the high frequency lateral power transistor device. The thin film resistor can be formed in an area above the gate region of the high frequency lateral power transistor device.

By means of providing a monolithically integrated circuit in accordance with the present invention, a thin film resistor with advantageous electrical and thermal properties is obtained. The inventive integrated circuit comprises (i) a thin film resistor, (ii) a high frequency lateral power transistor device including gate, source and drain regions, (iii) a Faraday shield layer region above the gate region, and (iv) at least a first metallization layer there above for electrical connection of the gate, source and drain regions through via holes filled with conductive material. The thin film resistor and the Faraday shield layer region are made in the very same conductive layer, preferably a bi-layer of Ti/TiN, and the conductive layer is arranged below the first metallization layer.

The conductive layer can easily be provided to have a resistivity in between the ranges indicated in the prior art section. Preferably, the conductive layer has a thickness in the range of about 400–3000 Å (10 Å=1 nm). Resistor contacts to the first metallization layer can be made in a conventional manner by via holes filled with conductive material.

In one embodiment source and drain contact regions are made in the same conductive layer as is used for the thin film resistor and the Faraday shield layer region. Here, one of the resistor contacts may be provided via the source contact region, and optionally ground.

Further characteristics of the invention and advantages thereof will be evident from the detailed description of preferred embodiments of the present invention given hereinafter and the accompanying FIGS. 1–5, which are given by way of illustration only, and thus are not limitative of the present invention.

DETAILED DESCRIPTION OF EMBODIMENTS

Figure 1:
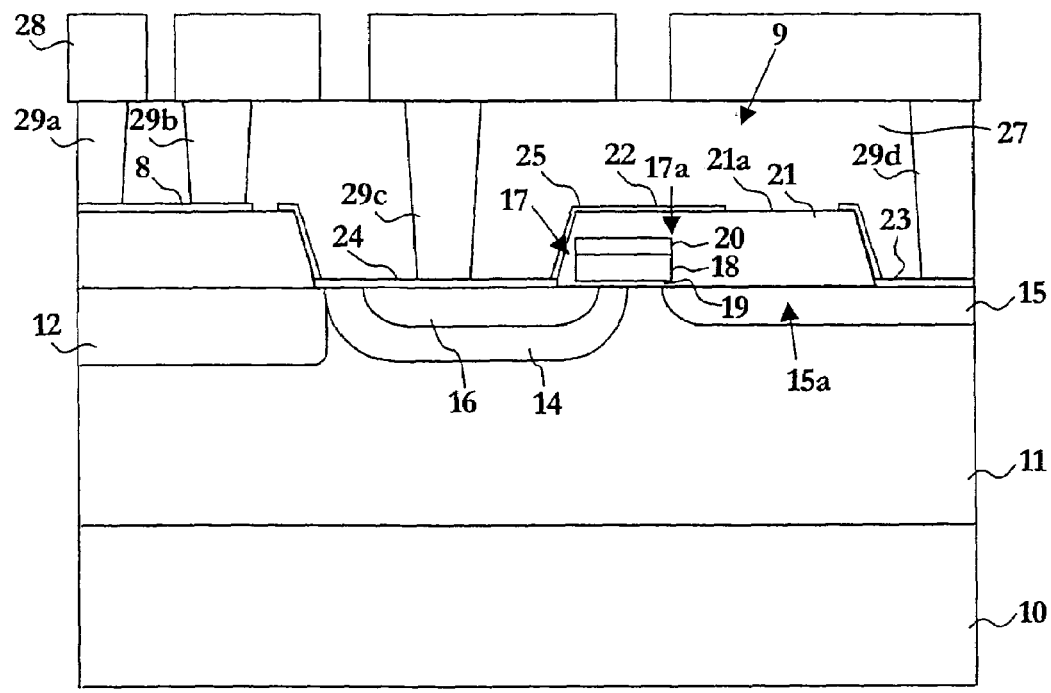
FIGS. 1–4 are each a highly enlarged schematic cross-sectional view of a portion of a semiconductor structure during processing according to a respective preferred embodiment of the present invention.

A monolithically integrated circuit including a thin film resistor 8 and an LDMOS transistor device 9 according to a preferred embodiment of the present invention is shown in FIG. 1 in an enlarged cross-sectional view. The integrated circuit, which is particularly adapted for high power and high frequency applications, comprises a P+ type doped semiconductor substrate 10, on which a P− type doped epitaxial layer 11 is formed.

A field oxide region 12 or an other insulating region such as e.g. a shallow trench insulation (STI) region, a P type doped well 14, and an N type doped drain region 15 are formed in the epitaxial layer 11, and an N type doped source region 16 is formed in the P type doped well 14. Further, a gate region 17 including a semiconductor layer region 18 on top of a gate insulation layer region 19 is formed on top of the epitaxial layer 11. A layer region 20 of lower resistivity, e.g. TiSi$_2$ or other silicide material, is formed on top of the gate semiconductor layer region 18.

According to the present invention a Faraday shield 22 is formed above the gate region 17 and in the same layer as the thin film resistor 8, which in this embodiment is located on top of the field oxide region 12. To this end an oxide region 21 is formed on top of the gate region 17, where the oxide region 21 overlaps the gate region 17 length completely, i.e. the oxide region 21 encapsulates the gate region 17. The oxide region 21 extends a certain distance into the area above the N type doped drain region 15 and has a substantially planar upper surface 21a. Preferably, the upper surface 21a is polished, e.g. by use of a chemical mechanical polishing (CMP) technique, or is planarized using masking and dry back etching. The oxide region is made of a thick oxide, preferably so that the oxide is about 500–2000 Å thick on top of the gate region 17 and about 4000–8000 Å thick elsewhere after planarization.

The thin film resistor 8 and the Faraday shield 22 are made in a thin conductive layer deposited on top of the oxide region 21, the epitaxial layer 11, and the field oxide region 12. The thickness of the thin conductive layer may be in the range of about 400–3000 Å, preferably in the range of about 400–1500 Å, more preferably in the range of about 600–1000 Å, and most preferably of about 800 Å. The thin conductive layer may comprise titanium, and is preferably a bi-layer of Ti/TiN. However it may be made of other materials including e.g. other transition metals.

The Faraday shield 22 covers preferably, as seen from above, an edge 17a of the gate region 17, which faces the drain region 15, and leaves a portion 15a of the drain region 15 uncovered as seen from above. The use of a planar oxide layer region 21 on top of the gate region 17 simplifies considerably the formation of the Faraday shield.

In the embodiment of FIG. 1, conductive layer regions 23, 24 for electrical connection of the drain and source regions 15, 16 may be provided in the very same conductive layer as is used for the thin film resistor 8 and the Faraday shield 22. Preferably, these contact layer regions 23, 24 are silicided in a heat treatment. Alternatively, the formation of the thin film resistor 8 and the Faraday shield 22 and the formation of the silicided source and drain contact layers 23, 24 are performed in two separate steps: firstly, titanium or other conductive material is deposited on source and drain areas, and is made to form a silicide, after which remaining conductive material that has not reacted with the silicon is removed, and secondly, conductive material, e.g. a bi-layer of Ti/TiN, is deposited and etched to form the thin film resistor 8 and the Faraday shield 22. This two-step method can be performed without the use of any further masks since the bi-layer of Ti/TiN may be formed on top of the silicided source and drain contact areas.

The Faraday shield 22 may be connected to any given electric potential, or it may be left freely floating without being connected at all. However, in the illustrated preferred embodiment the Faraday shield 22 is connected to the source contact region 24 and the source region 16 via a few narrow metal strips, of which one is shown as detail 25 in FIG. 1. The source region 16 is in turn preferably connected to ground.

In FIG. 1 a passivation layer 27, a first metal layer 28, and electrical connections 29a–d, i.e. via plugs filled with conductive material, between the circuit components, i.e. the thin film resistor 8 and the LDMOS transistor device 9, and the first metal layer 28 are shown. Electrical connections for the gate region may be provided in a similar manner (not illustrated in FIG. 1). It can thus be noted that the conductive layer, in which the thin film resistor and the Faraday shield 22 are made, is not part of the metallization of the integrated circuit, wherein about 0.8–1.5 micron thick metallic layers are provided and connected to the circuit components by means of via plugs filled with conductive material. The thin film resistor 8 is made in a thin conductive layer below the metallization layers of the transistor device. Hereby, a resistor having advantageous electrical and thermal properties can be fabricated in a typical CMOS or BiCMOS process without adding any additional complexity to the process.

A deposited Ti/TiN stack with layer thicknesses in the order of 300 Å/500 Å gave measured resistance values of about 27 Ohms/square and 31 Ohms/square for each layer respectively, leading to a resistance value of about 14 Ohms/square for the bi-layer, which is in between the 1–5 Ohms/square offered by a silicided gate material, and the 50–5000 Ohms/square offered by the conventional BiCMOS polycrystalline silicon resistors. This indicates that very attractive resistance values can be obtained by suitable design, e.g. for integrated trimming resistors in LDMOS circuits.

The temperature dependence of the inventive thin film resistor 8 is lower than that of the polycrystalline silicon gate layer resistor. In RF power devices, which by nature are operated at high temperatures and high frequencies, at which temperature effects and parasitic couplings are important for the performance and stability of the circuits, the inventive thin film resistor 8 is particularly advantageous.

It shall be understood that the inventive thin film resistor 8 may be provided in the conductive Faraday shield layer at any suitable lateral location of an integrated circuit, e.g. above an insulation region as is illustrated in FIG. 1, on top of the transistor device, or above other devices or components of the circuit.

Figure 2:
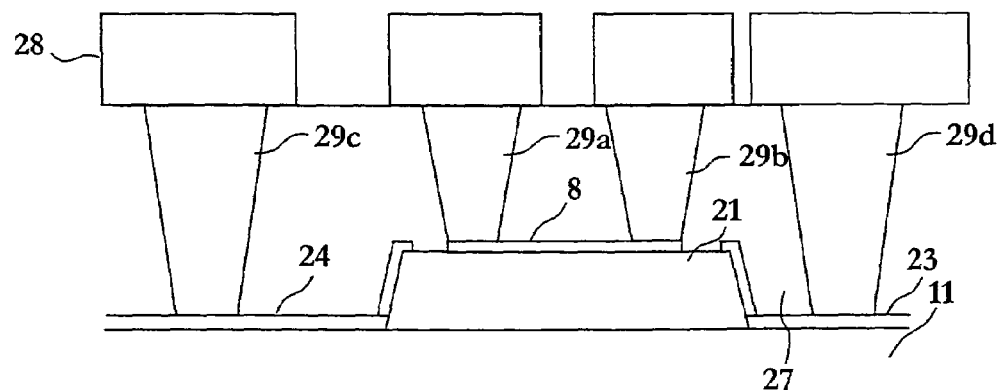

In FIG. 2 a cross section of a semiconductor structure is shown, where the thin film resistor 8 is provided on top of the oxide region 21, but outside of the area occupied by the LDMOS transistor device 9. The thin film resistor 8 is connected to the first metal layer 28 by via holes 29a, 29b filled with conductive material.

Figure 3:
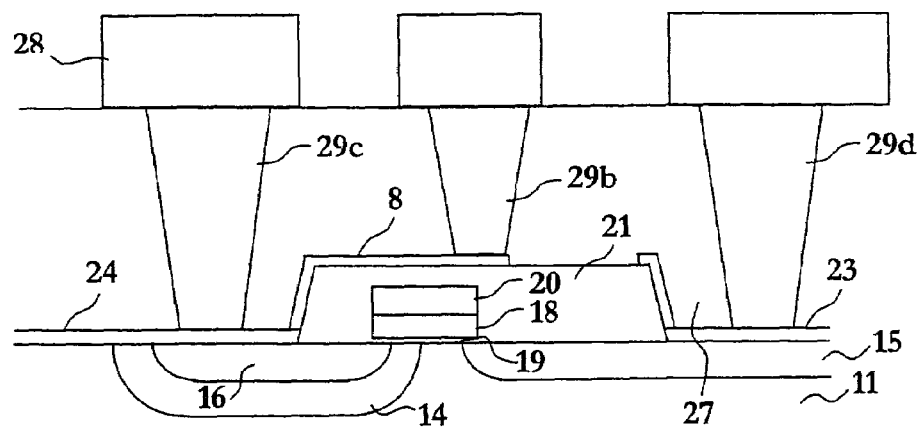

In FIG. 3 a cross section of a semiconductor structure is shown, where the thin film resistor 8 is provided on top of the LDMOS transistor device 9. The thin film resistor 8 may be located adjacent to the Faraday shield region or may constitute an integral part of the Faraday shield region, and is connected to the source contact region 24, and thus optionally to ground. The thin film resistor 8 is further connected to the first metal layer 28 by the resistor contact 29b, and the source contact 29c. Direct connection to ground may be needed in the circuit design, for instance for a damping resistor in series with a matching inductor to reduce the Q-value and increase the bandwidth.

Figure 4:
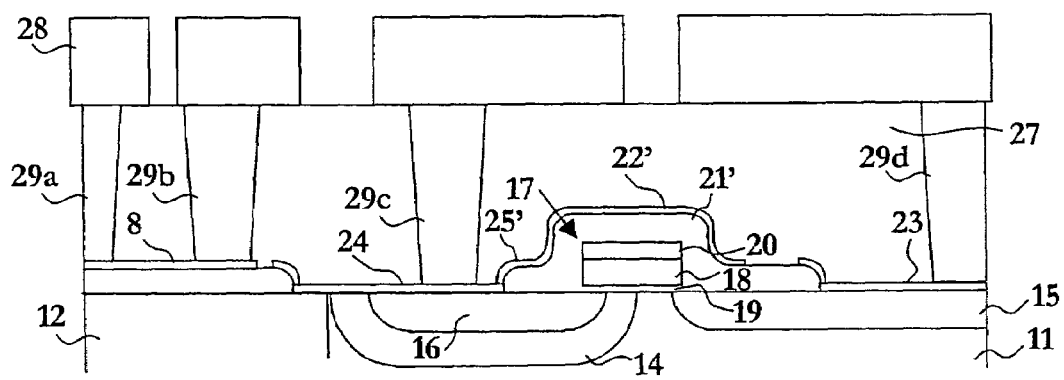

In FIG. 4 a cross section of a semiconductor structure is shown, where the thin film resistor 8 is provided on top of the field oxide region 12 similar to the embodiment of FIG. 1. However, in this embodiment the oxide on top of the gate region is not planarized, but deposited as a conformal layer, which is etched to form openings for the contact layer regions 23, 24 for the drain and source regions 15, 16, whereupon the oxide region, here denoted 21', is defined. As a consequence the upper surface of the oxide region 21' is not planar, and the Faraday shield, here denoted 22', is neither formed as a planar layer region, but follows the steps in the oxide region 21' caused by the gate region 17. The Faraday shield 22' may be connected to the source contact region 24 and the source region 16 via one or several metal strips 25'.

Figure 5:
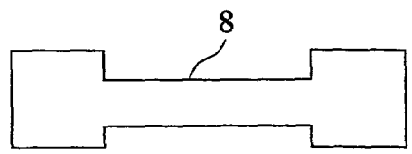
FIG. 5 is a top view of a metal film resistor comprised in any of the semiconductor structures as illustrated in FIGS. 1a–d.

In FIG. 5 the thin film resistor as comprised in any of the FIGS. 1a–d embodiments is shown in a top view.

It shall be appreciated that while the illustrated preferred embodiments of the present invention includes an LDMOS transistor device of NMOS type, the present invention is not limited in this respect. The invention is equally applicable to LDMOS transistor devices of PMOS type as well as to other kind of lateral power transistor devices.

It shall further be appreciated that while the present invention is primarily intended for radio frequency power silicon devices, it may as well be useful for smaller devices in silicon-based integrated radio frequency circuits. Further, the transistor device of the present invention may be realized in other materials such as e.g. SiC, GaAs, etc.

We claim:

1. A monolithically integrated circuit comprising:
   a thin film resistor,
   a high frequency lateral power transistor device including gate, source and drain regions, and a Faraday shield layer region above the gate region, and
   at least a first metallization layer there above for electrical connection of said gate, source and drain regions through via holes filled with conductive material, wherein
   said thin film resistor and said Faraday shield layer region are made in the same conductive layer, and
   said conductive layer is arranged below said at least first metallization layer.

2. The monolithically integrated circuit of claim 1, wherein said conductive layer has a thickness in the range of about 400–3000 Å, preferably in the range of about 400–1500 Å, more preferably in the range of about 600–1000 Å, and most preferably of about 800 Å.

3. The monolithically integrated circuit of claim 1, further comprising source and drain contact regions on top of said source and drain regions, wherein said source and drain contact regions are made in said conductive layer.

4. The monolithically integrated circuit of claim 3, wherein said thin film resistor is galvanically connected to said source contact region.

5. The monolithically integrated circuit of claim 1, wherein said thin film resistor is connected to said at least first metallization layer through at least one via hole filled with conductive material.

6. The monolithically integrated circuit of claim 1, wherein said conductive layer comprises a transition metal, particularly titanium.

7. The monolithically integrated circuit of claim 1, wherein said conductive layer is a bi-layer.

8. The monolithically integrated circuit of claim 1, wherein said thin film resistor is located in an area laterally separated from said high frequency lateral power transistor device.

9. The monolithically integrated circuit of claim 1, wherein said thin film resistor is located in an area above the gate region of said high frequency lateral power transistor device.

10. The monolithically integrated circuit of claim 1, wherein said power transistor device is an LDMOS device.

11. The monolithically integrated circuit of claim 1, wherein said Faraday shield layer region is provided on top of an oxide region, said Faraday shield layer region covering an edge of said gate region as seen from above, preferably an edge neighboring said drain region, and leaving a portion of said drain region uncovered as seen from above.

12. The monolithically integrated circuit of claim 11, wherein said oxide region overlaps with said gate region as seen from above, and has a substantially planar upper surface.

13. The monolithically integrated circuit of claim 12, wherein the upper surface of said oxide region is chemically mechanically polished or planarized using masking and dry back-etching.

* * * * *